United States Patent
Rief

(10) Patent No.: US 8,199,315 B2
(45) Date of Patent: Jun. 12, 2012

(54) PROJECTION OBJECTIVE FOR SEMICONDUCTOR LITHOGRAPHY

(75) Inventor: Klaus Rief, Aalen-Oberalfingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 902 days.

(21) Appl. No.: 12/131,430

(22) Filed: Jun. 2, 2008

(65) Prior Publication Data

US 2008/0285002 A1    Nov. 20, 2008

Related U.S. Application Data

(63) Continuation of application No. PCT/EP2006/011371, filed on Nov. 28, 2006.

(30) Foreign Application Priority Data

Dec. 3, 2005  (DE) .......................... 10 2005 057 860

(51) Int. Cl.
*G03B 27/52* (2006.01)
*G03B 27/42* (2006.01)

(52) U.S. Cl. .......................................... 355/55; 355/53
(58) Field of Classification Search .................... 355/67, 355/53, 51, 55
See application file for complete search history.

(56) References Cited

U.S. PATENT DOCUMENTS

| | | | |
|---|---|---|---|
| 5,428,482 A | 6/1995 | Bruning et al. | |
| 5,822,133 A | 10/1998 | Mizuno et al. | |
| 6,229,657 B1 | 5/2001 | Holderer et al. | |
| 6,307,688 B1 | 10/2001 | Merz et al. | |
| 6,473,245 B1 | 10/2002 | Spinali | |
| 2003/0090639 A1* | 5/2003 | Vogt | 355/51 |
| 2003/0234918 A1 | 12/2003 | Watson | |
| 2006/0187511 A1 | 8/2006 | Rau | |
| 2006/0209278 A1* | 9/2006 | Kiuchi et al. | 355/53 |

FOREIGN PATENT DOCUMENTS

| | | |
|---|---|---|
| DE | 195 39 581 | 4/1997 |
| EP | 0 665 389 | 8/1995 |
| EP | 0 964 281 | 12/1999 |
| EP | 1 014 139 | 6/2000 |
| JP | 2001-343575 | 12/2001 |
| JP | 2002-131605 | 5/2002 |
| WO | WO 2005006417 A1 * | 1/2005 |
| WO | WO 2005/017622 | 2/2005 |
| WO | WO 2005/091077 | 9/2005 |

OTHER PUBLICATIONS

Japanese patent attorney's English language translation of claim rejections in Japanese counterpart Application No. 2008-542647, including proposed claims amendments, bearing the date Sep. 27, 2011.

* cited by examiner

*Primary Examiner* — Peter B Kim
(74) *Attorney, Agent, or Firm* — Fish & Richardson P.C.

(57) ABSTRACT

Objectives, such as projection objectives for semiconductor lithography, are disclosed. An objective generally has an optical axis and optical elements mounted in an objective housing. Projection exposure apparatuses having an objective are also disclosed. In addition, guides and adjusting systems for an optical element in an objective are disclosed. Further, related components and methods are disclosed.

44 Claims, 6 Drawing Sheets

PROJECTION OBJECTIVE FOR SEMICONDUCTOR LITHOGRAPHY

CROSS-REFERENCE TO RELATED APPLICATIONS

The present application is a continuation of PCT/EP2006/011371, filed Nov. 28, 2006, which claims benefit of German Application No. 10 2005 057 860.8, filed Dec. 3, 2005. The contents of PCT/EP2006/011371 are hereby incorporated by reference.

FIELD

The disclosure relates to an objective, such as a projection objective for semiconductor lithography, having an optical axis and having optical elements mounted in an objective housing. The disclosure also relates to a projection exposure apparatus having an objective. The disclosure furthermore relates to a guide and adjusting system for an optical element. In addition, the disclosure relates to related components and methods.

BACKGROUND

An objective, such as a projection objective designed to be used in semiconductor lithography to produce semiconductor elements, generally contains optical elements, e.g. lenses and mirrors. It is often desirable to be able to very precisely align the optical elements because there are often extremely stringent performance characteristics on the imaging accuracy of the objective. It is known to use manipulators in an objective to position the optical elements.

SUMMARY OF THE DISCLOSURE

The disclosure can provide an objective, such as a projection objective for semiconductor lithography, designed so that the optical elements can be moved or adjusted in a plurality of degrees of freedom with extremely high accuracy. The movement or adjustment can be achieved by one or more adjusting devices. The design of the adjusting devices can be relatively simple.

In some embodiments, the objective has an optical axis and optical elements mounted in an objective housing. At least one optical element is mounted in an inner part connected to an outer part via an intermediate part. Adjusting devices are provided, which make it possible to realize, depending on their actuation, relative movements between the outer part and the intermediate part and between the intermediate part and the inner part in a plane perpendicular to the optical axis (z), parallel to the optical axis (z), and in directions tilted relative to the optical axis (z).

In contrast to at least some known mountings of an optical element in an inner part and in an outer part, an extremely high adjustment accuracy can be achieved via the intermediate part according to the disclosure and the connection of the intermediate part to the inner part and the outer part. In some instances, adjustments or displacements in one direction or the alteration of one degree of freedom can have no effect on the other degrees of freedom.

By virtue of the configuration or mounting of the optical element according to the disclosure, the optical element can be guided and manipulated not only in all translational degrees of freedom but also in rotational degrees of freedom. In this case, the individual displacements or adjustments of the optical element can be performed such without alteration in a direction or a rotation or torsion in which no alteration is desired.

In some embodiments, the adjusting devices are supported on the outer part and in each case act on a lever mechanism, the center of rotation of which is fixedly connected to the intermediate part. With a lever mechanism, step-down and step-up ratios of the adjustments can also be achieved in a simple manner depending on the length of the individual levers.

In certain embodiments, the lever mechanism has three levers and is supported on the intermediate part in such a way that in the event of actuation of the adjusting devices, a relative movement occurs between the outer part and the intermediate part only in a plane perpendicular to the optical axis (z) and/or in a direction parallel to the optical axis (z) and/or tiltings with respect to the optical axis (z) only occur between the inner part and the intermediate part.

If the optical element is a lens, the inner part, outer part and intermediate part can be in each case concentrically arranged rings, with the adjusting devices generally arranged in a manner distributed at a distance of 120° with respect to one another on the circumference. In this case, the center of rotation of all three lever mechanisms for the adjusting devices may each be fixedly connected to the intermediate ring.

Optionally, if the intermediate part is formed from a plurality of ring segments, such as three ring segments, the possibilities with regard to adjusting the optical element can become even greater. This holds true particularly when each ring segment has a dedicated adjusting device. The individual ring segments can form a closed ring, in which case they may be connected to one another by a rigid or an elastic connecting part.

By virtue of this configuration, it is possible e.g. to combine an adjustment of the optical element in an axis perpendicular to the optical axis with an adjustment parallel to the optical axis. Furthermore, an individual arrangement of degrees of freedom may be utilized for constructing a redundancy within the objective in respect of the failure of individual degrees of freedom in the field. In other words, if one possibility of adjustment fails at other optical elements in the system, its task may, if appropriate, be concomitantly undertaken by the apparatus according to the disclosure.

A further considerable advantage of the configuration according to the disclosure is that the number of degrees of freedom to be driven can be minimized via an individual arrangement of the manipulable degrees of freedom within the objective. This leads, therefore, to a minimization of the actuator system and hence adjusting devices, to a reduced sensor system and likewise to a minimization of control electronics. Production costs and structural space can also be reduced in this way.

Exemplary embodiments of the disclosure from which further features according to the disclosure emerge are described in principle below with reference to the drawings.

DETAILED DESCRIPTION

Figure 1:
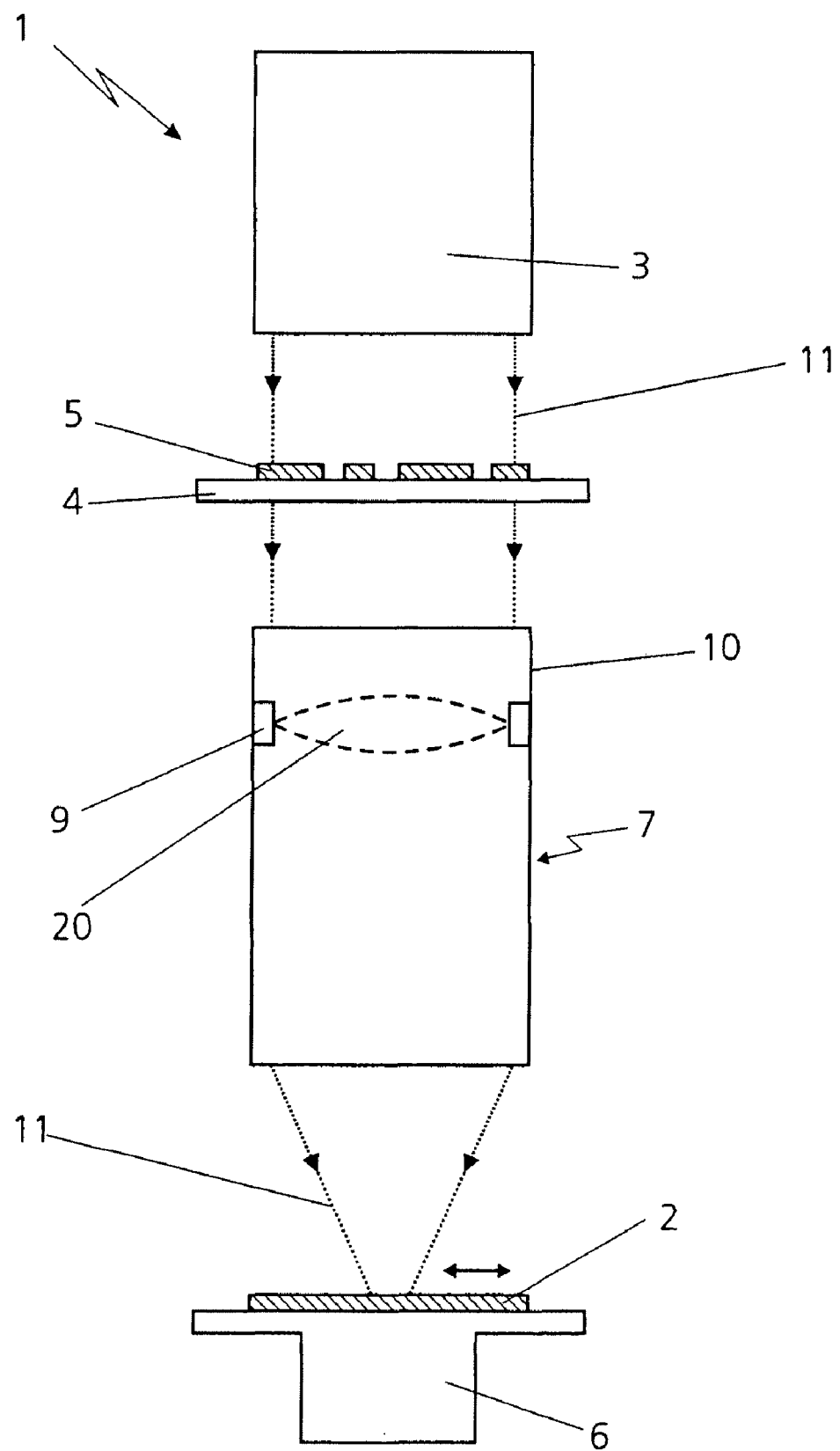
FIG. 1 shows a basic illustration of a projection exposure apparatus with a projection objective.

FIG. 1 illustrates a projection exposure apparatus 1 for microlithography. This serves for the exposure of structures on a substrate coated with photosensitive materials, which substrate generally predominantly includes silicon and is referred to as a wafer 2, for the production of semiconductor components, such as e.g. computer chips.

In this case, the projection exposure apparatus 1 essentially includes an illumination device 3, a device 4 for receiving and exactly positioning a mask provided with a grating-like structure, a so-called reticle 5, via which the later structures are imaged on a reduced scale on the wafer 2, a device 6 for the mounting, movement and exact positioning of the wafer 2, and an imaging device, namely a projection objective 7, having a plurality of optical elements, such as e.g. lenses and mirrors, which are mounted in an objective housing of the projection objective 7 via holders 9. For simplification, only one optical element 20 is illustrated in FIG. 1.

After exposure has been effected, the wafer 2 is moved further step by step in the arrow direction, so that a multiplicity of individual fields, each having the structure predefined by the reticle 5, can be exposed on the same wafer 2. On account of the step-by-step advancing movement of the wafer 2 in the projection exposure apparatus 1, the latter is often also referred to as a stepper.

The illumination device 3 provides a projection beam 11 for imaging the reticle 5 on the wafer 2, for example light or an electromagnetic radiation. A laser, by way of example, may be used as a source of the radiation. The radiation is shaped via optical elements in the illumination device 3 such that the projection beam 11 has the desired properties with regard to diameter, polarization, shape of the wavefront and the like when it impinges on the reticle 5.

An image of the reticle 5 is generated via the projection beam 11 and is transferred to the wafer 2 in correspondingly demagnified fashion by the projection objective 7, as has already been explained above. The projection objective 7 has a multiplicity of individual refractive, diffractive and/or reflective optical elements, such as e.g. lenses, mirrors, prisms, terminating plates and the like.

Figure 2:
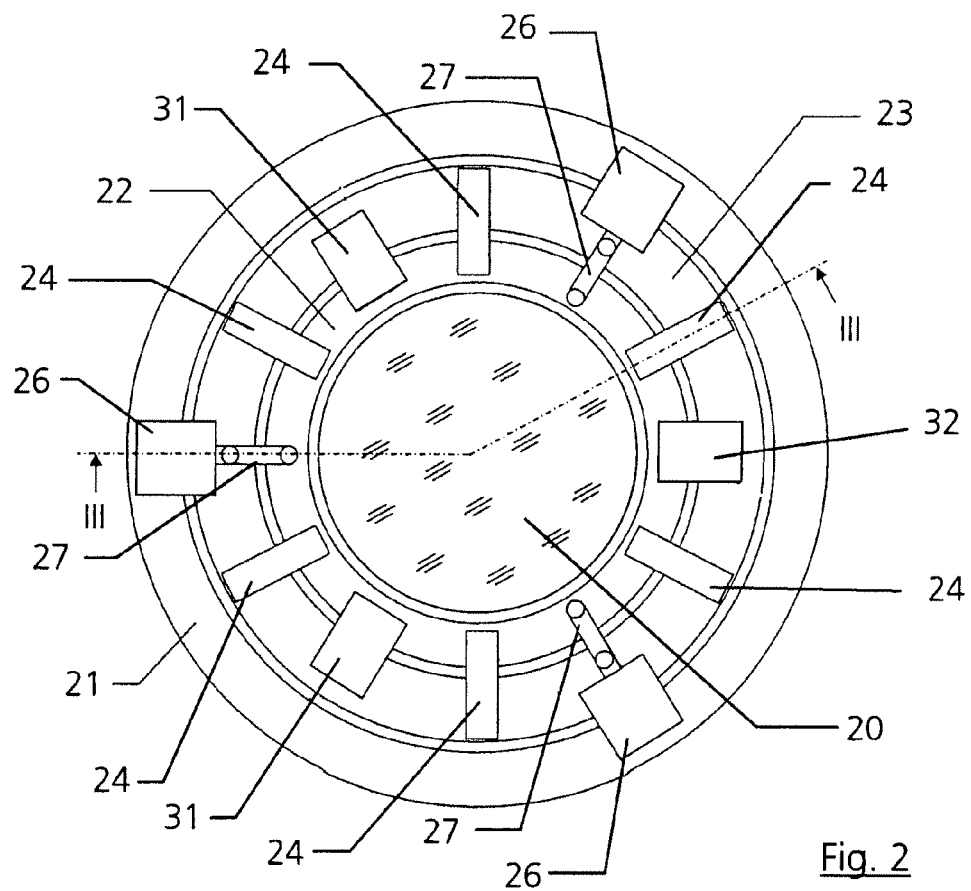
FIG. 2 shows a plan view of a lens as optical element to be adjusted.

FIG. 2 and subsequent figures reveal the mounting of an adjustable optical element, in this case a lens 20, in the projection objective 7 together with associated adjusting devices. The mounting and adjusting device has three concentrically arranged rings, namely an outer ring 21 as outer part, which is fixedly connected to the objective housing 10 of the projection objective 7, an inner ring 22 as inner part and an intermediate ring 23 as intermediate part. The inner ring 22 is fixedly connected to the optical element 20. The intermediate ring 23 is mounted relative to the inner ring 22 and the outer ring 21 via guide systems.

As can be seen from FIG. 2, six guide systems are provided e.g. in a manner distributed over the circumference at a distance of 60°. Other numbers may also be provided as desired for the relative connection and guidance. Each guide system has two leaf springs 24 lying in a plane perpendicular to the optical axis, namely the x/y plane, one leaf spring 24 in each case being arranged on a circumferential side. In the present case, this therefore means on the top side and on the underside of the intermediate ring 23 given a perpendicular position of the optical element 20. The two leaf springs 24 of each guide system are likewise connected to the inner ring 22 on the top side and the underside. The two leaf springs 24 may in each case be embodied as a concentric ring or else as individual ring segments arranged in a manner distributed over the circumference. Perpendicular to the two leaf springs 24, each guide system has a guide element 25 formed from a plurality of individual ring segments arranged in a manner distributed over the circumference or from a plurality of individual elements, e.g. elastic pins, distributed over the circumference. As can be seen from FIG. 3, the longitudinal axis of the guide element 25 extends parallel to the optical axis, namely to the z-axis.

On account of their configurations and position, the two leaf springs 24 have a high stiffness in the x/y plane, but in contrast a low stiffness in the optical axis, and thus permit movements in the optical axis or parallel to the optical axis.

By contrast, the guide element 25 has a high stiffness in the z-direction and a low stiffness in the x/y plane and thus permits movements in the x/y plane.

Three manipulators or actuators 26 are arranged at a distance of 120° and are mounted in each case on and in the outer ring 21. The number of actuators 26 is also to be regarded only by way of example. The actuating forces of the actuators 26 are transmitted via a lever mechanism 27 to the inner ring 22 and thus to the optical element 20.

Each lever mechanism 27 has three articulation points. One articulation point 28 is connected to the actuator 26 in an articulated manner, while a second articulation point 29 is connected to the inner ring 22 in an articulated manner. A third articulation point 30, which is likewise articulated, is situated on the intermediate ring 23 and constitutes a fixed center of rotation for the articulation points 28 and 29.

Figure 4:
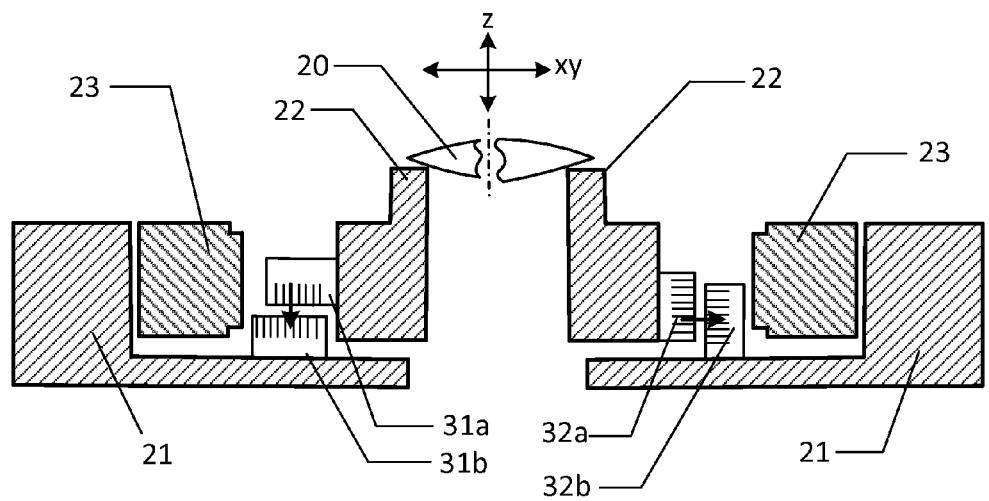
FIG. 4 shows a section through the optical element according to FIG. 2 for illustrating the sensor system.

For determining the adjustment of the optical element 20, sensors 31a, 31b and 32a, 32b are provided, as can be seen from FIG. 4. The sensors are arranged between the inner ring 22 and the outer ring 21, the two sensors 31a and 31b measuring relative movements of the inner ring 22 with respect to the outer ring 21 in the optical axis (z-direction) and the two sensors 32a and 32b measuring relative movements between the inner ring 22 and the outer ring 21 in the x/y plane. A wide variety of possibilities may be used as sensors. In general, capacitive or incremental displacement sensors or else sensors based on the piezoelectric effect will be used. Their method of operation is generally known, for which reason it will not be discussed in greater detail here.

Figure 3:
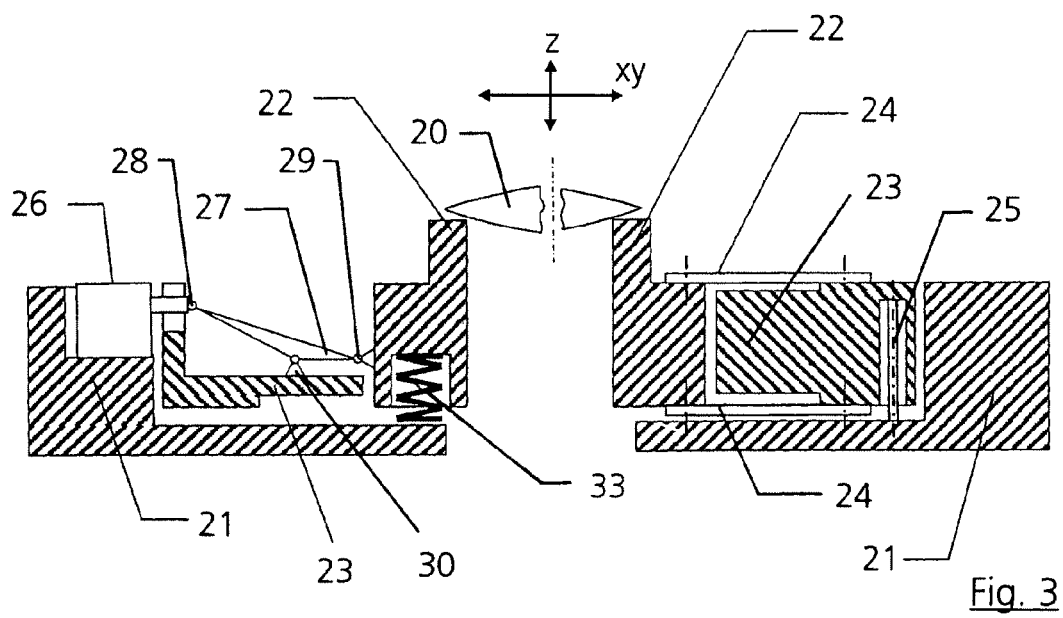
FIG. 3 shows a section according to the line III-II in FIG. 2.
Figure 5:
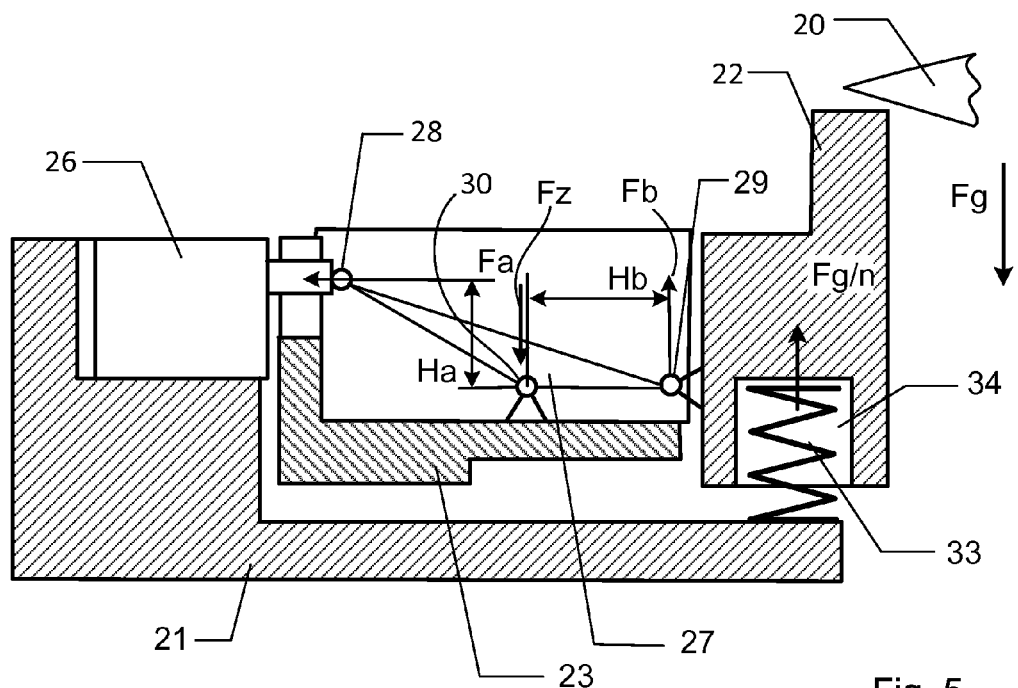
FIG. 5 shows an enlarged representation of the left-hand half of FIG. 3 with illustration of the adjusting forces and adjusting directions.

The static weight force Fg of the optical element 20 together with the inner ring 22 is supported via spring elements 33 (see FIG. 3 and enlarged illustration in FIG. 5). Helical springs, by way of example, may be used as the spring elements 33, a plurality of helical springs being arranged in cutouts 34 of the inner ring 22 in a manner distributed on the circumference.

The functioning of the adjustment of the optical element 20 is explained below with reference to FIG. 5. Each of the three actuators 26 distributed on the circumference generates a radial force Fa on the associated lever mechanism 27, which force is supported via the linking of the lever mechanism 27 at the intermediate ring 23 with the force Fz at the articulation point 30, which simultaneously serves as a pivot. The height offset Ha between the point of application of the radial force Fa at the articulation point 29 and the articulation point 30 at the intermediate ring 23 causes a moment at the lever mechanism, which is supported via a vertical force Fb at the articulation point 29.

Hb represents the distance between the articulation points 29 and 30 in the plane perpendicular to the optical axis.

The position of the centers of rotation at the articulation points 30 of all the lever mechanisms 27 arranged in a manner distributed over the circumference is fixedly defined with respect to one another for the intermediate ring 23. If a rotationally symmetrical arrangement is taken into account, then no parasitic forces occur and the three supporting forces Fz are equal in magnitude. With a symmetrical construction, the vertical forces Fb are likewise equal in magnitude, as a result of which all the actuator forces Fa are also equal in magnitude.

The weight force Fg is supported by the spring elements 33 arranged in a manner distributed on the circumference, the respective supporting force being Fg/n. In this case, n denotes the number of spring elements 33 arranged in a manner distributed on the circumference.

The following possibilities of adjustment are possible with the actuators 26 and the lever mechanisms 27:

Case 1—Adjustment in the Z-direction (Optical Axis):

As a result of a uniform actuation of all three actuators 26, the intermediate ring 23 remains in its position. All the lever mechanisms 27 pivot about their articulation point 30 as a pivot, as a result of which the inner ring 22 moves in the z-direction.

Case 2—Adjustment in the x/y Plane:

If the actuators 26 are moved in such a way that the articulation points 28 maintain their relative distance from one another, then, analogously to the displacement of all the articulation points 28, the intermediate ring 23 with the lever mechanisms 27 and the inner ring 22 is also displaced arbitrarily in the x/y plane. For this purpose, the three sensors 32a and 32b arranged in a manner distributed on the circumference are arranged such that they can detect the movements in the x/y plane. As a result of the actuators being subjected to displacements with different magnitudes at the articulation points 28, it is possible to effect adjustment in each case in the desired direction in the x/y plane, it merely being desirable to take care to ensure that all the articulation points 28 maintain their relative distance from one another during the displacement. For this purpose, the different angular positions with respect to the respective displacement direction have to be taken into consideration, of course, given an arrangement of the actuators at a distance of 120° from one another. The sensors 31a and 31b, of which there are likewise in each case three arranged in a manner distributed on the circumference, measure the displacement in the z-direction and/or displacements in the x/y plane.

Via controlled operation and a combination of case 1 and case 2, the optical element 20 can thus be displaced arbitrarily and without high outlay in the x-/y-/z-direction.

Step-down and step-up ratios can be initiated by way of the distances and vertical positions of the articulation points 28, 29 and 30 of the lever mechanism 27 with respect to one another and thus their geometrical design. This depends, in particular, on the quantities Ha and Hb of the two articulation points 29 and 30 and the distance between the articulation points 28 and 30.

In principle, any drive unit which operates appropriately sensitively is possible for the actuators 26. These are desirably self-locking, however. One possibility in this respect is e.g. a piezo-stepper drive.

Instead of the leaf springs 24, articulated-joint beams arranged uniformly on the circumference are also possible in the context of the guide system. The same applies to the guide element 25, which may be provided as a rotationally symmetrical bending or articulated-joint beam. A guide with removed sections, e.g. L-sections, is also possible.

Figure 6:
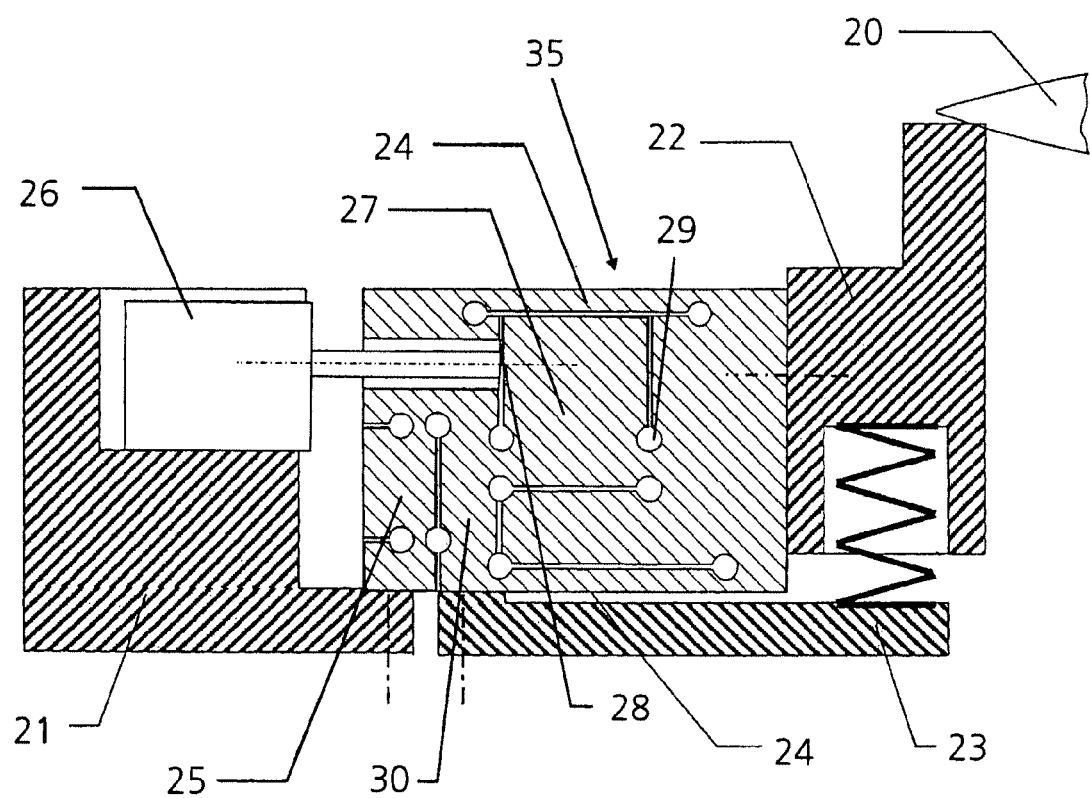
FIG. 6 shows an enlarged representation of the left-hand half of FIG. 3 with a monolithically produced removed part for the adjusting device instead of a lever mechanism.

A guide system together with the lever mechanism 27 as a removed part in a monolithic configuration can be seen from FIG. 6. For this purpose, in a manner corresponding to the number of actuators 26, monolithic blocks 35 are provided between the inner ring 22 and the outer ring 21, each block 35 being supported on the intermediate ring 23. Furthermore, the block 35 is connected to the inner ring 22 and the outer ring 21. By removing sections with corresponding extended holes at their ends, corresponding diameter reductions and thus elastic connections are achieved which replace the guide system with the leaf springs 24 and the guide element 25 and the lever mechanism 27 with the articulation points 28, 29 and 30. For illustration purposes, however, the corresponding parts with the same reference symbols have been inserted into the block 35 since, after all, the block 35 in principle produces the same construction and primarily the same effect. The removed sections and the cutouts or holes may be introduced e.g. via a laser.

Figure 7:
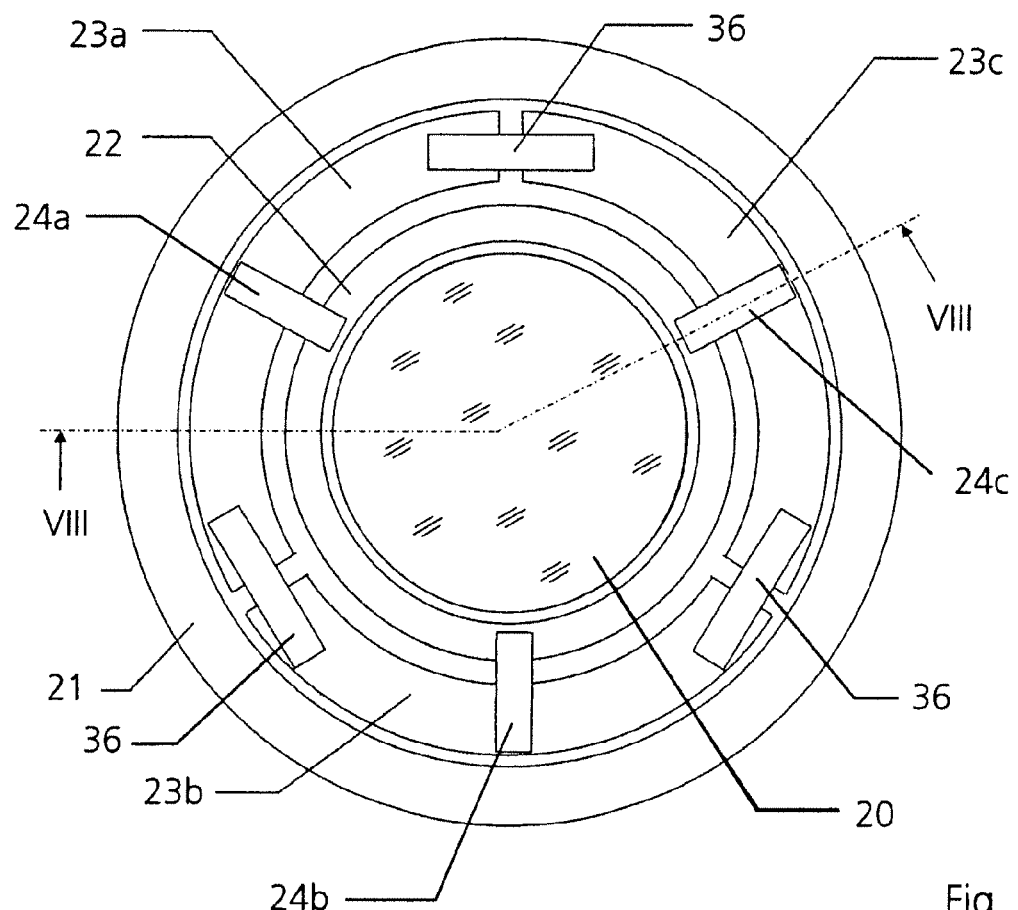
FIG. 7 shows a plan view corresponding to the representation of FIG. 2 in a different embodiment.
Figure 8:
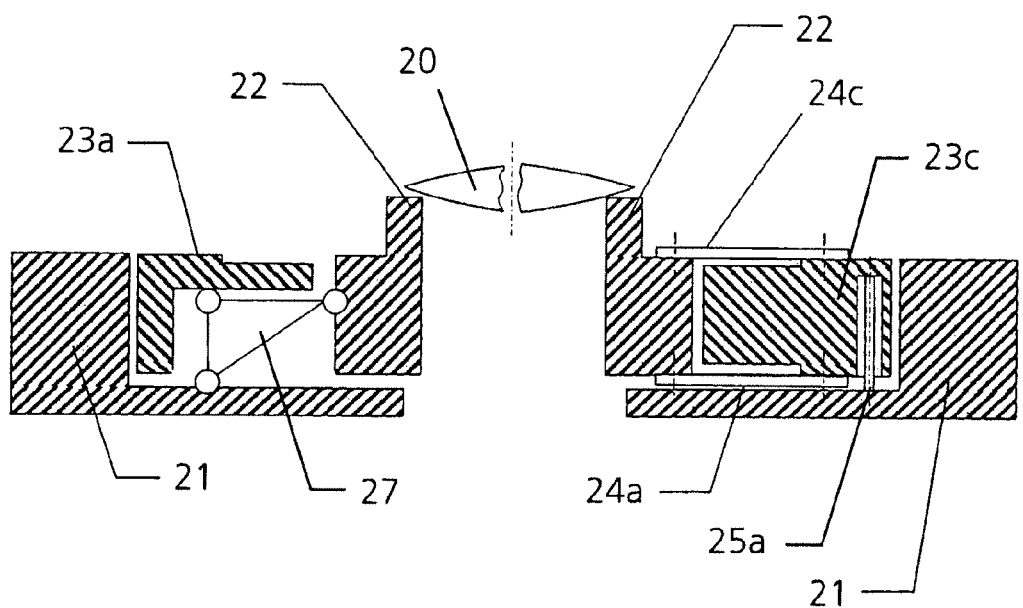
FIG. 8 shows a section through FIG. 7 according to the line VIII-VIII.

FIGS. 7 and 8 describe additional aspects. The formulated problem, as described in the exemplary embodiment above, where individual degrees of freedom can be driven actively, is in principle the same. In the exemplary embodiment above, however, it was emphasized that the tilting degrees of freedom of a z-tilting manipulator or actuator are replaced by x/y degrees of freedom. A more general form of the problem solution is possible with the exemplary embodiment described below.

As can be seen, an inner ring 22 and an outer ring 21 are likewise present here. However, the intermediate ring is divided into three ring segments 23a, 23b and 23c. The outer ring 21 is once again fixedly connected to the objective housing, while the inner ring 22 carries the optical element, namely the lens 20.

Guide systems and actuators may be fitted in various ways between the two rings 21, 22 and the ring segments 23a, 23b and 23c. In this case, leaf springs 24a, 24b and 24c correspond to the leaf springs 24 of the first exemplary embodiment and constitute in the same way the adjustable connection between the inner ring 22 and the individual ring segments 23a, 23b, 23c of the correspondingly divided intermediate ring. The leaf springs 24a, 24b, 24c guide the ring segments 23a, 23b, 23c in the radial direction. Connecting parts 36 connect the three ring segments 23a, 23b, 23c to form a closed ring, which thus corresponds to the intermediate ring 23 of the first exemplary embodiment. The connecting parts 36 may optionally be embodied as rigid connections, elastic connections and also as actuating drives.

Figure 9:
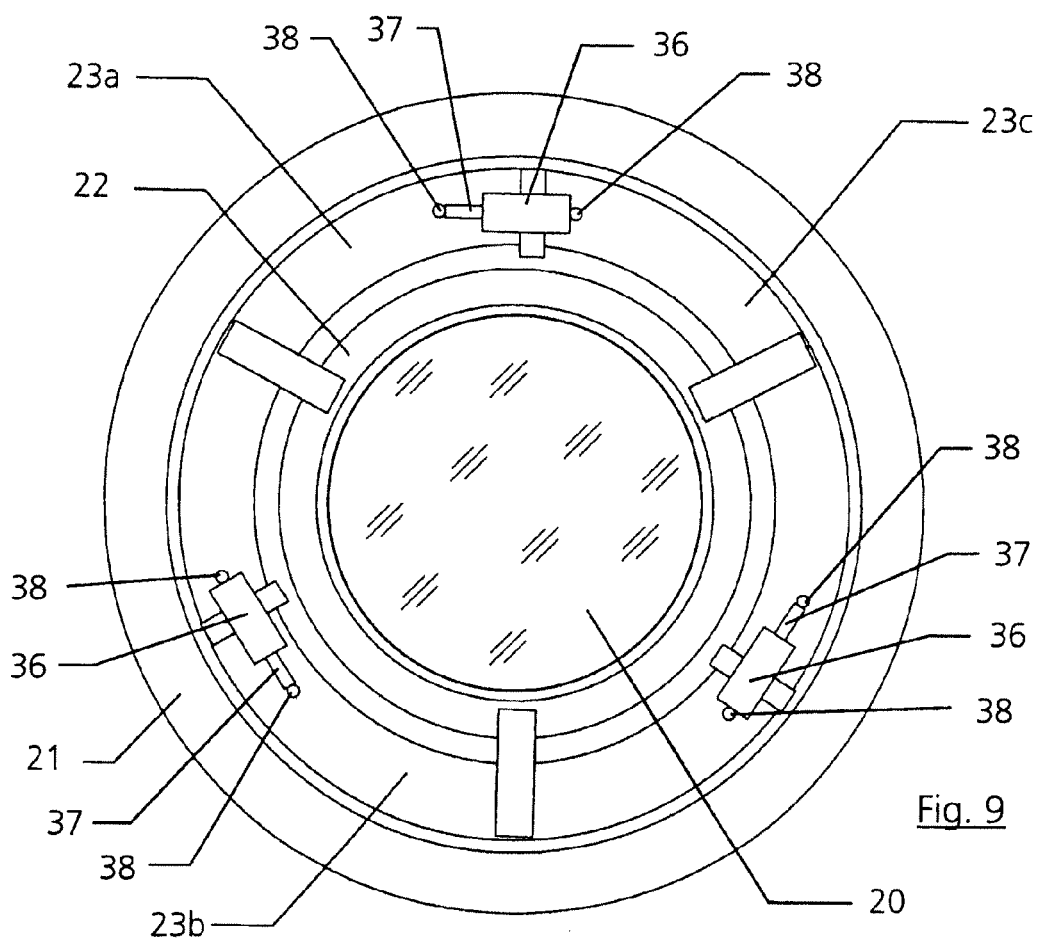
FIG. 9 shows a plan view in a similar configuration to that illustrated in FIG. 7.

FIG. 9 shows a configuration wherein the connecting parts 36 are in each case provided with an actuating drive 37. The actuating drive 37 may be embodied e.g. as a linear motor with a guide element which enables displacements in the circumferential direction. A wide variety of devices may be used as linear drives, such as e.g. mechanical, electromechanical, hydraulic or piezoelectric devices. In order to compensate for angular movements, articulated-joint connections 38 will be provided between the actuating drive 37 and the connecting parts 36. The construction and method of operation of an actuating drive are generally known, for which reason they are not discussed in any greater detail here.

In the same way as in the first exemplary embodiment, here as well a lever mechanism 27 is in each case present between the inner ring 22, the outer ring 21 and in each case one of the three ring segments 23a, 23b, 23c. The lever mechanisms 27 can likewise be actuated by an actuator (not illustrated). Guide elements 25a having the same function as in the first exemplary embodiment serve in the same way for the guidance in the z-direction of the three ring segments 23a, 23b, 23c.

The structural principle according to FIGS. 7 and 8 makes it possible to construct different actuators which are in each case adapted to the desired characteristics of adjusting the objective. Individual degrees of freedom can be driven actively here or else be embodied as passive guides or even be completely inhibited. By virtue of the intermediate ring being divided into three ring segments, the possibilities of variation are significantly greater here. This is possible in particular because the three ring segments can be provided with actuators individually or else independently of one another and the number of possibilities of adjustment thus rises accordingly.

Figure 10:
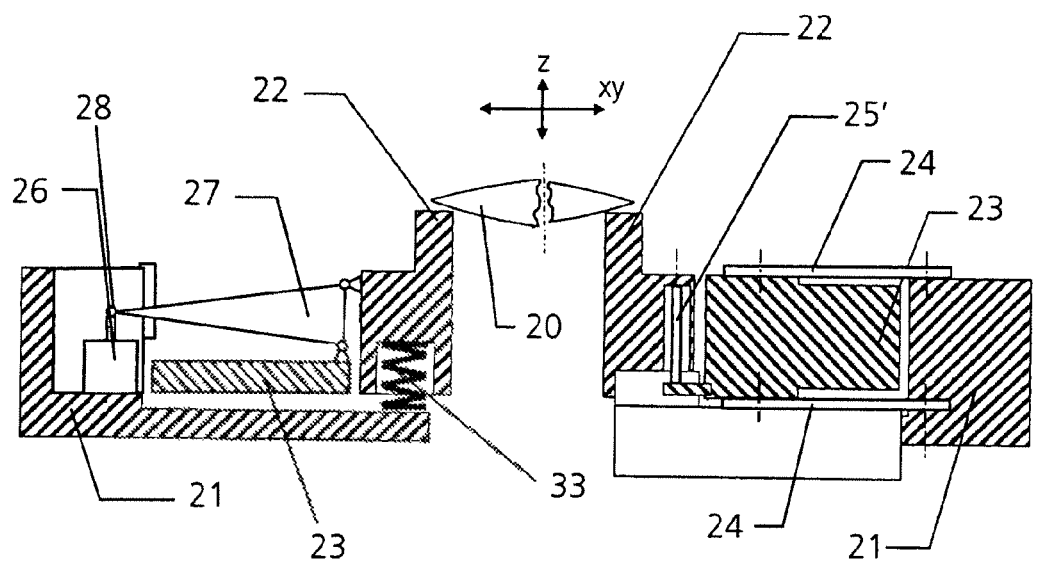
FIG. 10 shows a section in a similar configuration to that illustrated in FIG. 3.

The arrangement of the guide systems, as described above, can also be reversed. This means that a relative movement between the outer ring 21 and the intermediate ring 23 only takes place in the z-direction, while the relative movement between the inner ring 22 and the intermediate ring 23 takes place in the x/y plane. As is evident in this respect from FIG. 10, in this case the leaf springs 24 are arranged between the intermediate ring 23 and the outer ring 21 and a guide element 25', corresponding to the guide element 25 according to FIG. 3, is fixedly arranged on the intermediate ring 23 and projects into a cutout in the inner ring 22.

The guide systems and drives or actuators are also interchangeable or can be combined with one another.

What is claimed is:

1. An objective having an optical axis, comprising:
an objective housing;
an inner part;
an intermediate part;
an outer part connected to the inner part via the intermediate part;
at least one optical element mounted in the objective housing, the at least one optical element being mounted in the inner part; and
at least one adjusting device configured to enable relative movement between the outer part and the intermediate part and between the intermediate part and the inner part, wherein:
the relative movement results in movement of the at least one optical element which is a combination of a translation of the at least one optical element perpendicular to the optical axis, a translation of the at least one optical element parallel to the optical axis, and a tilting of the at least one optical element relative to the optical axis;
the at least one adjusting device comprises a lever mechanism configured to act on the outer part and on the intermediate part, a center of rotation thereof being fixedly connected to the intermediate part via an articulation point; and
the objective is a semiconductor lithography objective.

2. The objective according to claim 1, wherein the at least one adjusting device is supported on the outer part and is configured to act on the lever mechanism.

3. The objective according to claim 1, wherein the lever mechanism is supported on the intermediate part in such a way that in the event of actuation of the at least one adjusting device, a relative movement between the outer part and the intermediate part can be realized only at an angle with respect to the optical axis, and between the intermediate part and the inner part there is established a relative movement only in a direction parallel to the optical axis and/or tiltings relative to the optical axis.

4. The objective according to claim 3, wherein the relative movement between the outer part and the intermediate part can be realized in a plane perpendicular to the optical axis.

5. The objective according to claim 1, wherein the lever mechanism is supported on the intermediate part in such a way that in the event of actuation of the at least one adjusting device, it is possible to realize a relative movement between the outer part and the intermediate part only in a direction parallel to the optical axis and/or in a direction tilted with respect to the optical axis, in which case, between the inner part and the intermediate part, it is possible to realize a relative movement only at an angle with respect to the optical axis.

6. The objective according to claim 5, wherein the angle is perpendicular to the optical axis.

7. The objective according to claim 1, further comprising an elastic guide system to connect the outer part, the intermediate part and the inner part.

8. The objective according to claim 7, wherein the elastic guide system comprises at least one first element selected from the group consisting a leaf spring and an articulated joint beam, the at least one first element is arranged about a circumference of the at least one optical element, and the at least one first element has a high stiffness in a plane perpendicular to the optical axis and a low stiffness parallel to the optical axis.

9. The objective according to claim 8, wherein the at least one element is between the intermediate part and the inner part.

10. The objective according to claim 8, wherein the at least one first element is integral with the parts connected thereto.

11. The objective according to claim 8, wherein the guide system and the lever mechanism are formed from a removed part with monolithic articulated joints.

12. The objective according to claim 7, wherein the elastic guide system comprises at least one first element selected from the group consisting of an articulated joint and a bending beam, and the at least one first element has a high stiffness parallel to the optical axis and a low stiffness in a plane perpendicular to the optical axis.

13. The objective according to claim 12, wherein the at least one first element is between the outer part and the intermediate part.

14. The objective according to claim 7, wherein the elastic guide system and the at least one adjusting device are mutually interchangeable.

15. The objective according to claim 1, wherein the outer part, the intermediate part and the inner part are concentric rings.

16. The objective according to claim 1, wherein the inner part and the outer part are concentric rings, and the intermediate part comprises at least three ring segments.

17. The objective according to claim 16, wherein the at least three ring segments are connected to one another by connecting parts.

18. The objective according to claim 17, wherein the connecting parts are provided with actuating drives.

19. The objective according to claim 16, wherein the at least one adjusting device is configured to act on each of the at least three ring segments.

20. The objective according to claim 1, wherein the at least one adjusting device comprises at least three adjusting devices uniformly distributed about a circumference of the at least one optical element.

21. The objective according to claim 1, further comprising sensors between the outer part and the inner part.

22. The objective according to claim 1, further comprising spring elements supported on the outer part to take up a weight force of the at least one optical element.

23. The objective according to claim 22, wherein the spring elements comprise a plurality of helical springs distributed about a circumference of the at least one optical element, and the plurality of helical elements are guided in cutouts in the inner part.

24. An apparatus, comprising:
the objective of claim 1,
wherein the apparatus is a semiconductor lithography projection exposure apparatus.

25. A guide and adjusting system configured to be used with an optical element arranged in an objective housing having an optical axis, wherein the optical element is mounted in an inner part connected to an outer part via an intermediate part, the guide and adjusting system comprising:
at least one adjusting device to enable relative movement between the outer part and the intermediate part and between the intermediate part and the inner part, the relative movement resulting in movement of the at least one optical element which is a combination of a translation of the optical element perpendicular to the optical axis, a translation of the optical element parallel to the optical axis, and a tilting of the optical element relative to the optical axis,
wherein the at least one adjusting device comprises a lever mechanism, which can act on the outer part and on the intermediate part, a center of rotation thereof being fixedly connected to the intermediate part via an articulation point.

26. The guide and adjusting system according to claim 25, wherein the at least one adjusting device is supported on the outer part and can act on the lever mechanism.

27. The guide and adjusting system according to claim 25, wherein the lever mechanism is supported on the intermediate part in such a way that in the event of actuation of the at least one adjusting device, a relative movement between the outer part and the intermediate part can be realized only at an angle with respect to the optical axis, and between the intermediate part and the inner part there is established a relative movement only in a direction parallel to the optical axis and/or tiltings relative to the optical axis.

28. The guide and adjusting system according to claim 25, further comprising an elastic guide system to connect the outer part, the intermediate part and the inner part.

29. The guide and adjusting device according to claim 28, wherein the elastic guide system comprises at least one first element selected from the group consisting of a leaf spring and an articulated joint beam, the at least one first element is arranged about a circumference of the optical element, and the at least one first element has a high stiffness in the plane perpendicular to the optical axis and a low stiffness parallel to the optical axis.

30. The guide and adjusting device according to claim 29, wherein the at least one first element is between the intermediate part and the inner part.

31. The guide and adjusting device according to claim 28, wherein the guide system comprises at least one first element selected from the group consisting of an articulated-joint and a bending beam, the at least one first element has a high stiffness parallel to the optical axis and a low stiffness in a plane perpendicular to the optical axis.

32. The guide and adjusting device according to claim 31, wherein the at least one first element is between the outer part and the intermediate part.

33. An objective having an optical axis, comprising:
an objective housing;
an inner part;
an intermediate part;
an outer part connected to the inner part via the intermediate part;
at least one optical element mounted in the objective housing, the at least one optical element being mounted in the inner part;
an elastic guide system to connect the outer part, the intermediate part and the inner part; and
at least one adjusting device configured to enable relative movement between the outer part and the intermediate part and between the intermediate part and the inner part,
wherein:
the relative movement results in movement of the optical element which is a combination of a translation of the at least one optical element perpendicular to the optical axis, a translation of the at least one optical element parallel to the optical axis, and a tilting of the at least one optical element relative to the optical axis; and
the objective is configured to be used in semiconductor lithography.

34. The objective according to claim 33, wherein the elastic guide system comprises at least one first element selected from the group consisting a leaf spring and an articulated joint beam, the at least one first element is arranged about a circumference of the at least one optical element, and the at least one first element has a high stiffness in a plane perpendicular to the optical axis and a low stiffness parallel to the optical axis.

35. The objective according to claim 34, wherein the at least one element is between the intermediate part and the inner part.

36. The objective according to claim 34, wherein the at least one first element is integral with the parts connected thereto.

37. The objective according to claim 34, wherein the at least one adjusting device comprises a lever mechanism configured to act on the outer part and on the intermediate part, a center of rotation thereof is fixedly connected to the intermediate part via an articulation point, and the guide system and the lever mechanism are formed from a removed part with monolithic articulated joints.

38. The objective according to claim 33, wherein the elastic guide system comprises at least one first element selected from the group consisting of an articulated joint and a bending beam, and the at least one first element has a high stiffness parallel to the optical axis and a low stiffness in a plane perpendicular to the optical axis.

39. The objective according to claim 38, wherein the at least one first element is between the outer part and the intermediate part.

40. The objective according to claim 33, wherein the elastic guide system and the at least one adjusting device are mutually interchangeable.

41. An apparatus, comprising:
the objective of claim 33,
wherein the apparatus is a semiconductor lithography projection exposure apparatus.

42. An objective having an optical axis, comprising:
an objective housing;
an inner part;
an intermediate part;
an outer part connected to the inner part via the intermediate part;
at least one optical element mounted in the objective housing, the at least one optical element being mounted in the inner part;
spring elements supported on the outer part to take up a weight force of the at least one optical element; and
at least one adjusting device configured to enable relative movement between the outer part and the intermediate part and between the intermediate part and the inner part, wherein:
the relative movement results in movement of the at least one optical element which is a combination of a translation of the at least one optical element perpendicular to the optical axis, a translation of the at least one optical element parallel to the optical axis, and a tilting of the at least one optical element relative to the optical axis; and
the objective is configured to be used in semiconductor lithography.

43. The objective according to claim 42, wherein the spring elements comprise a plurality of helical springs distributed about a circumference of the at least one optical element, and the plurality of helical elements are guided in cutouts in the inner part.

44. An apparatus, comprising:
the objective of claim 42,
wherein the apparatus is a semiconductor lithography projection exposure apparatus.

* * * * *

UNITED STATES PATENT AND TRADEMARK OFFICE
CERTIFICATE OF CORRECTION

PATENT NO. : 8,199,315 B2  Page 1 of 1
APPLICATION NO. : 12/131430
DATED : June 12, 2012
INVENTOR(S) : Klaus Rief It is certified that error appears in the above-identified patent and that said Letters Patent is hereby corrected as shown below:

Column 3, line 32, delete "housing of" insert --housing 10 of--.

Signed and Sealed this
Twenty-eighth Day of August, 2012

David J. Kappos
*Director of the United States Patent and Trademark Office*